(12) United States Patent
Liang et al.

(10) Patent No.: US 11,709,533 B2
(45) Date of Patent: *Jul. 25, 2023

(54) POWER CHIP

(71) Applicant: Delta Electronics (Shanghai) CO., LTD, Shanghai (CN)

(72) Inventors: Le Liang, Shanghai (CN); Xiaoni Xin, Shanghai (CN)

(73) Assignee: Delta Electronics (Shanghai) CO., LTD, Shanghai (CN)

( * ) Notice: Subject to any disclaimer, the term of this patent is extended or adjusted under 35 U.S.C. 154(b) by 227 days.

This patent is subject to a terminal disclaimer.

(21) Appl. No.: 16/950,918

(22) Filed: Nov. 18, 2020

(65) Prior Publication Data

US 2021/0072807 A1 Mar. 11, 2021

Related U.S. Application Data

(63) Continuation-in-part of application No. 16/159,803, filed on Oct. 15, 2018, now Pat. No. 10,871,811, (Continued)

(30) Foreign Application Priority Data

Aug. 26, 2016 (CN) .......................... 201610738910.9

(51) Int. Cl.
| | | |
|---|---|---|
| *G06F 1/26* | (2006.01) | |
| *H01L 23/522* | (2006.01) | |
| *H01L 23/528* | (2006.01) | |
| *H01L 23/498* | (2006.01) | |
| *H01L 23/66* | (2006.01) | |
| *H01L 25/16* | (2023.01) | |
| *H03K 17/16* | (2006.01) | |
| *H01L 25/07* | (2006.01) | |
| *H01L 29/00* | (2006.01) | |
| *H03K 17/14* | (2006.01) | |

(52) U.S. Cl.
CPC .......... *G06F 1/26* (2013.01); *H01L 23/49822* (2013.01); *H01L 23/5223* (2013.01); *H01L 23/5286* (2013.01); *H01L 23/66* (2013.01); *H01L 25/072* (2013.01); *H01L 25/162* (2013.01); *H03K 17/168* (2013.01); *H01L 29/00* (2013.01); *H03K 17/145* (2013.01); *H03K 17/162* (2013.01)

(58) Field of Classification Search
CPC ... G06F 1/26; H01L 23/49822; H01L 25/162; H01L 25/072; H01L 23/66; H03K 17/168
See application file for complete search history.

(56) References Cited

U.S. PATENT DOCUMENTS

2008/0135932 A1* 6/2008 Ozeki .................. H01L 25/074
257/334

* cited by examiner

*Primary Examiner* — Walter H Swanson
(74) *Attorney, Agent, or Firm* — Qinghong Xu

(57) ABSTRACT

A power chip includes: a first power switch, formed in a wafer region and having a first and a second metal electrodes; a second power switch, formed in the wafer region and having a third and a fourth metal electrodes, wherein the first and second power switches respectively constitute an upper bridge arm and a lower bridge arm of a bridge circuit, and the first and second power switches are alternately arranged; and a metal region, at least including a first metal layer and a second metal layer that are stacked, each metal layer including a first to a third electrodes, and electrodes with the same voltage potential in the metal layers are electrically coupled.

20 Claims, 35 Drawing Sheets

Related U.S. Application Data which is a continuation of application No. 15/613,389, filed on Jun. 5, 2017, now Pat. No. 10,126,795.

US 11,709,533 B2

POWER CHIP

CROSS REFERENCE

This application is a continuation-in-part application of U.S. application Ser. No. 16/159,803, which is a continuation application of U.S. application Ser. No. 15/613,389, which is based upon and claims priority to Chinese Patent Application No. 201610738910.9, filed on Aug. 26, 2016, the entire contents thereof are incorporated herein by reference.

TECHNICAL FIELD

The present disclosure relates to a power chip, and more particularly, to a power chip which may reduce parasitic inductance.

BACKGROUND

With growth of people's demand for an ever intelligent lifestyle, demand for high capacity of data processing is also growing. The global energy consumption in data processing has reached about hundreds of billions of or even trillions of kilowatts-hour each year, and a large data center can occupy an area up to tens of thousands of square meters. Accordingly, high efficiency and high power density are significant indicators of a health development of the data center industry.

A critical unit of the data center is a server, which is typically equipped with a mainboard composed of data processing chips (such as a CPU, chipsets, a memory or the like), their power supplies and necessary peripheral components. With increase of the processing capacity per unit volume of a server, the number and the integration level of the processing chips are also increasing, resulting in enlargement of occupied space and increase of power consumption. Accordingly, the power supply (also referred to as a mainboard power supply since it is on the same mainboard as the data processing chips) for the chips is expected to have higher efficiency, higher power density and smaller volume, so as to facilitate the energy saving and reduction of the occupied resource for the entire server or even of the entire data center.

SUMMARY

According to an aspect of the present disclosure, there is provided a power chip, including:

a first power switch; formed in a wafer region, each first power switch having a first metal electrode and a second metal electrode;

a second power switch, formed in the wafer region, each second power switch having a third metal electrode and a fourth metal electrode, wherein the first power switch and the second power switch respectively constitute an upper bridge arm and a lower bridge arm of a bridge circuit, at least one bridge arm of the upper bridge arm and the lower bridge arm comprises two or more power switches parallel to each other, wherein the first power switch and the second power switch are arranged alternately; and a metal region, comprising a first metal layer and a second metal layer that are stacked, wherein each of the first metal layer and the second metal layer comprises first electrodes, second electrodes and third electrodes, and electrodes among the first, second and third electrodes with the same voltage potential in the first metal layer and the second metal layer are electrically coupled.

DETAILED DESCRIPTION

Hereinafter, a number of different embodiments or examples are provided to implement various features of the present disclosure. The following is a specific embodiment or example which discloses various elements and arrangements, to simplify description of the present disclosure. Of course, these are only examples, but not limited thereto. For example, in the description, a structure in which the first feature is located above the second feature may include a form that the first feature is in direct contact with the second feature, and it may also include a form that an additional feature is interposed between the first feature and the second feature, such that the first feature and the second feature are not in direct contact. In addition, reference numbers and/or symbols will be repeated in various examples of the present disclosure. The foregoing repetition is for the purpose of simplification and clarity, rather than specifying relationships in various embodiments and/or configurations.

In addition, spatially related terms, such as "underlying", "below", "lower", "overlying", "upper", or the like are used herein for describing the relationship between one element or feature and another element or feature exemplified in the figures. The spatially related terms may include different orientations of the device in use or operation other than the orientation depicted in the figures. The device may be oriented (rotated 90 degrees or in other orientations) in other ways, and the spatially related descriptors used herein should be understood accordingly.

Figure 1:
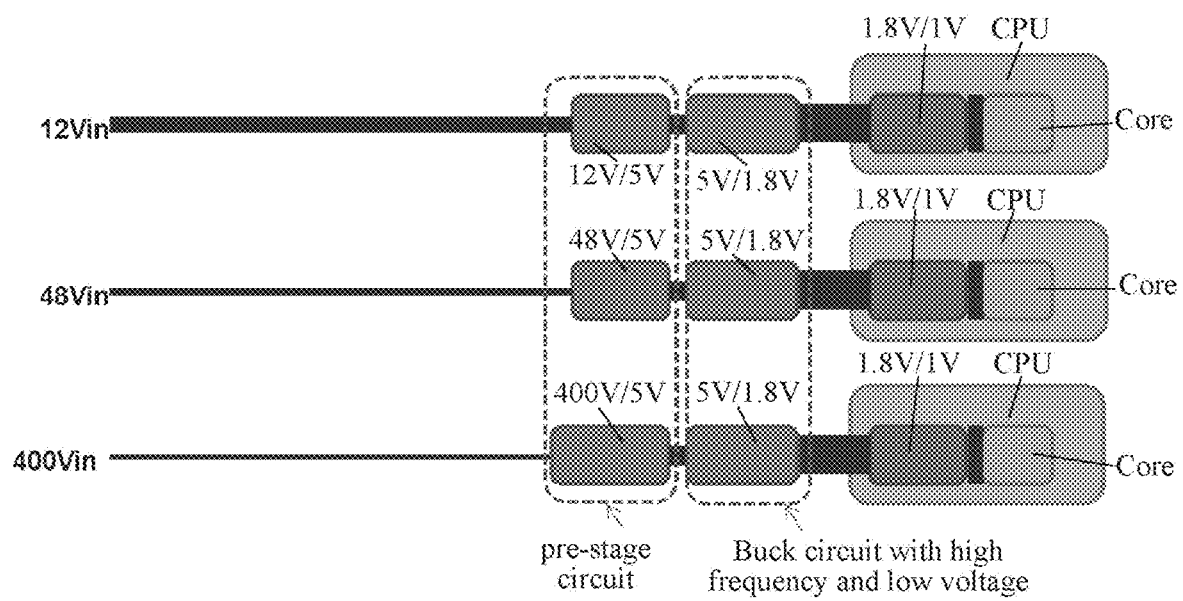
FIG. 1 is a schematic diagram of a circuit architecture of a low voltage Buck circuit converting 5V to 1.8V.
Figure 2:
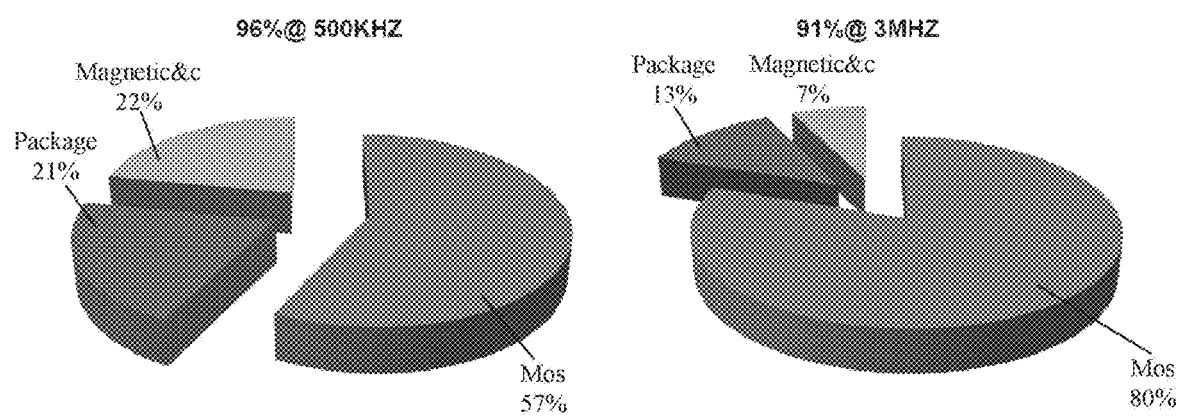
FIG. 2 is a schematic diagram of a change in a loss percentage of the power device according to a change of frequency in the Buck circuit.

In order to increase the power density, there is a potential demand for continuously increasing a frequency of a low voltage BUCK circuit converting 5V to 1.8V in a circuit architecture as shown in FIG. 1. Meanwhile, increasing the frequency may also increase dynamic response speed to a CPU load change. However, as shown in FIG. 2, as the frequency increases, a proportion of the loss of a power device MOS greatly increases, which becomes a main bottleneck of a high efficiency target.

Figure 3:
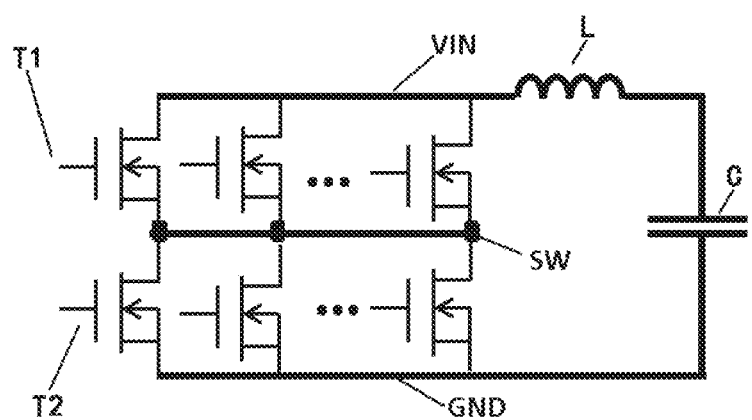
FIG. 3 is a schematic diagram of a bridge Buck circuit.
Figure 4:
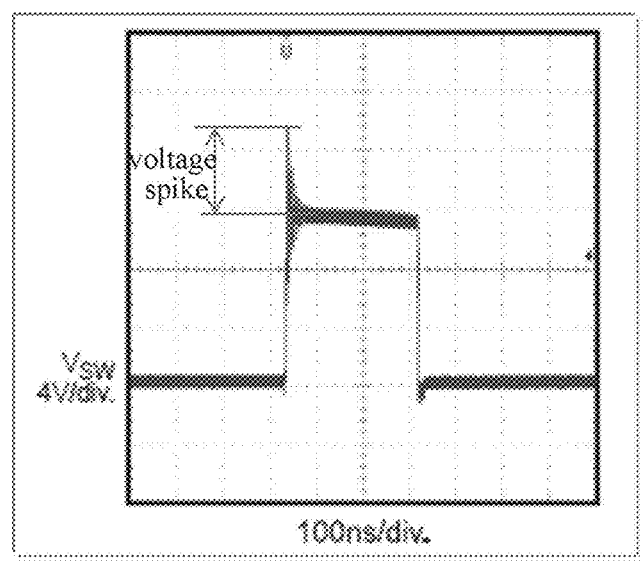
FIG. 4 is a schematic diagram of a voltage spike change across the power switch when the power switch in the Buck circuit turns off.
Figure 5:
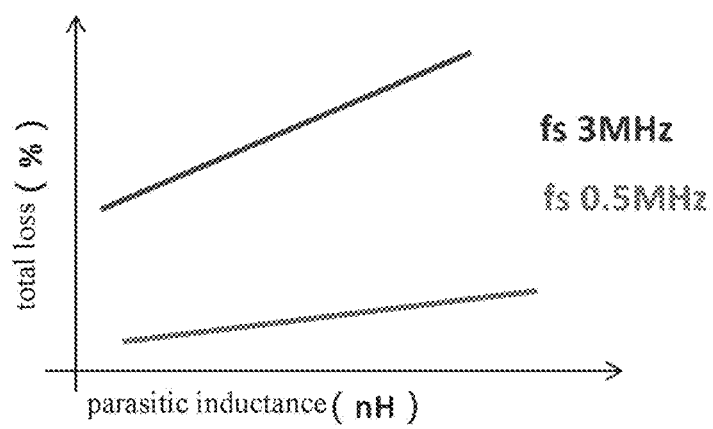
FIG. 5 is a schematic diagram of a parasitic inductance and a switch loss under different switch frequencies in the bridge Buck circuit.

The efficiency of the Buck circuit is relevant to parasitic inductance of a commutation circuit. As shown in FIG. 3, an input capacitor C, a first power switch T1 and a second power switch T2 constitute a closed commutation circuit, wherein the first power switches T1 are connected in parallel to form an upper bridge arm, and the second power switches T2 are connected in parallel to form a lower bridge arm. A parasitic inductance value may occur in the closed commutation circuit at a moment of the first power switch turning on or turning off. The equivalent position of the parasitic inductance in the commutation circuit is shown in FIG. 3. The smaller the parasitic inductance L of the commutation circuit is, the higher the efficiency of the Buck circuit will be. This may be reflected in the following two aspects: 1) the smaller the parasitic inductance is, the smaller the voltage spike across the power switch when being turned off is, so a power switch with better performance and lower voltage may be employed, thus increasing efficiency of the Buck circuit, as shown in FIG. 4; and 2) the smaller the parasitic inductance is, the smaller the switching loss is, thus increasing efficiency of the Buck circuit, as qualitatively shown in FIG. 5. The higher the switching frequency is, the more significant influence of the parasitic inductance has on the efficiency.

Figure 6:
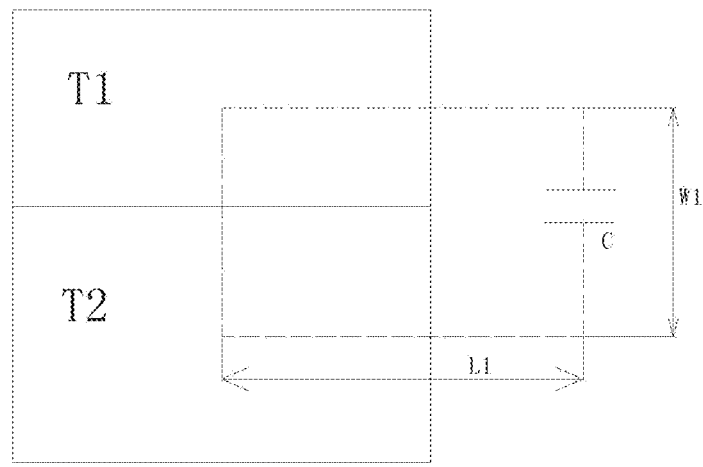
FIG. 6 is a plan schematic diagram of the first power switch and the second power switch being separately arranged in a power chip.
Figure 7:
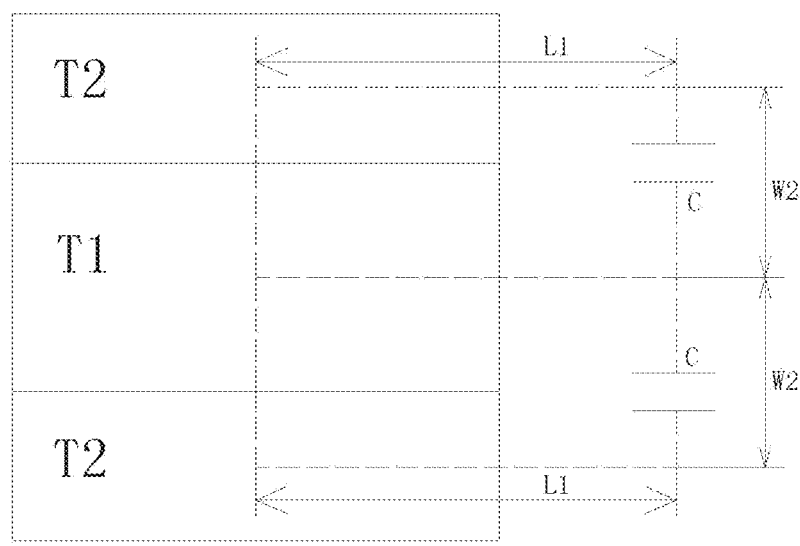
FIG. 7 shows a plan schematic diagram of the power switches with an alternately arranged structure in a power chip according to an embodiment of the present disclosure.

It can be seen that, in order to increase efficiency of the Buck circuit with high frequency and low voltage, it is a key point to reduce parasitic inductance of the commutation circuit. In integrated chips, the first power switch T1 and the second power switch 12 are separated as two regions, as shown in FIG. 6. At this time, a size of the equivalent high frequency commutation circuit is related to a geometrical center distance W1 between the first power switch T1 and the second power switch T2 and a distance L1 between geometrical centers of the first power switch T1 and the second power switch T2 and the input capacitor C. An area of the commutation circuit equals to W1*L1, which approximately equals to a quarter of an area of the power chip. Thus, the size of the high frequency commutation circuit is related to the area of the power chip. On the other hand, the area of the power chip is determined by an optimal design under multiple factors considered, such as a power load and an optimum efficiency point. It is difficult to consider reduction of the high frequency commutation circuit at the same time, which has a degree of inflexibility, FIG. 7 is a plan schematic diagram of the power switch arrangement in a power chip according to an embodiment of the present disclosure. As shown in FIG. 7, the power chip 10 includes a wafer region, a metal region, a plurality of first power switches T1 and a plurality of second power switches 12.

The first power switch T1 and the second power switch T2 are integrated in the power chip 10, which respectively constitute an upper bridge arm and a lower bridge arm of a bridge circuit. At least one bridge arm of the upper bridge arm and the lower bridge arm includes two or more power switches which are connected in parallel to each other. For example, in some embodiments, there is a single first power switch T1, and there are two or more second power switches T2. Alternatively, there are two or more first power switches T1, and there is a single second power switch T2. The first power switch T1 has a first metal electrode and a second metal electrode. The second power switch T2 has a third metal electrode and a fourth metal electrode. Structurally, the first power switches T1 and the second power switch 12 may be disposed along at least one dimension direction.

In the present embodiment, for example, the first power switch T1 and the second power switch T2 are alternately arranged along the Y direction (vertical direction). However, an arrangement of the first power switch T1 and the second power switch T2 is not limited to this. The first power switch T1 and the second power switch T2 may also be alternately arranged along the X direction (horizontal direction), or alternately arranged along the X direction and Y direction. In the embodiment, the first power switch T1, the second power switch T2 and a capacitor C outside the power chip 10 are connected to form a commutation circuit. The equivalent circuit is shown as FIG. 3. An area of the commutation circuit is S2=W2*L1, wherein W2 represents a geometrical center distance between the first power switch T1 and the second power switch 12, and L1 represents a distance between geometrical centers of the power switches and the external capacitor C.

Under the same area of the power chip, compared with the case as shown in FIG. 6 where the first power switch T1 and the second power switch 12 are separately arranged, the case in the present embodiment where the first power switch T1 and the second power switch T2 are alternately arranged may reduce the geometrical center distance between the first power switch T1 and the second power switch T2, i.e. W2<W1. Under the same distance L1 between geometrical centers of the power switches and the capacitor, the area of the commutation circuit correspondingly reduces, thus reducing the size of the commutation circuit, weakening influence of the parasitic inductance, and improving efficiency of the power chip. In the present embodiment, the first power switch T1 and the second power switch T2 are alternately arranged once, however, the times that the first power switch T1 and the second power switch T2 are alternately arranged may vary depending on actual needs. The more times the first power switch T1 and the second power switch T2 are alternately arranged, the smaller the geometrical center distance between the first power switch T1 and the second power switch T2 will be. The commutation circuit will reduce correspondingly, which may further improve efficiency of the power chip.

Hereinafter, a wiring manner of the metal region will be described in detail by taking an example that the first power switch T1 and the second power switch T2 are alternately arranged along the Y direction.

Figure 8:
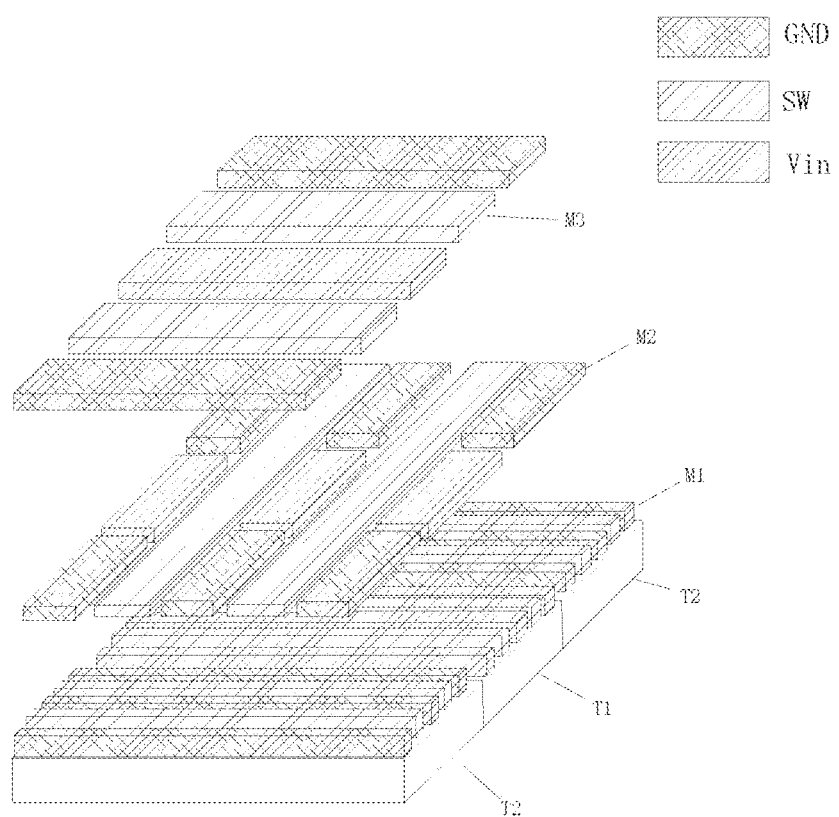
FIG. 8 shows a stereoscopic view of a power chip according to an embodiment of the present disclosure.
Figure 8A:
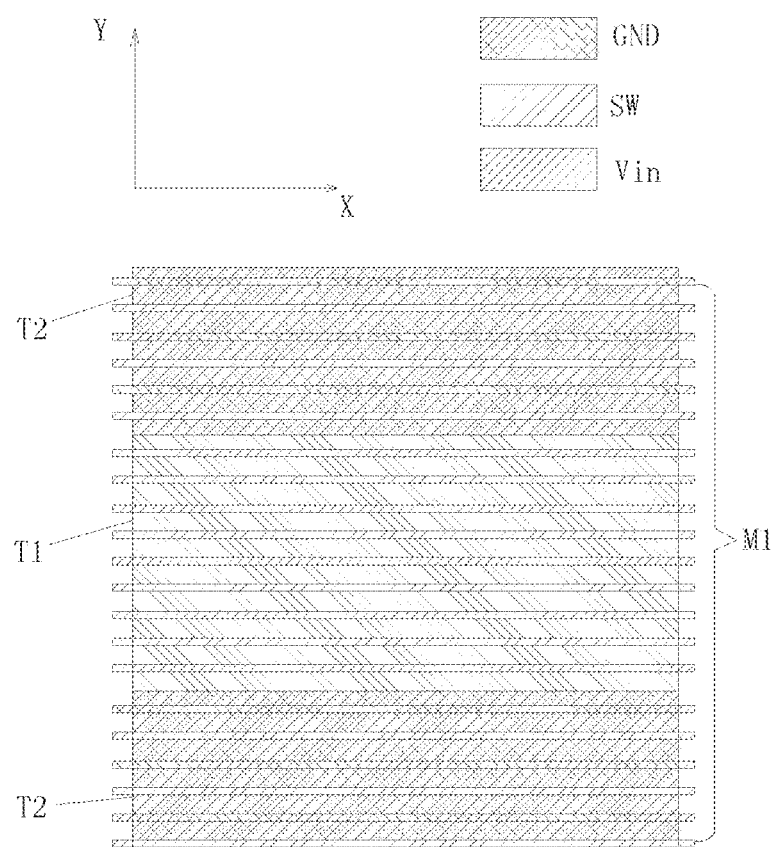
FIGS. 8a-8c show schematic diagrams of wiring of a metal region in a power chip according to an embodiment of the present disclosure.
Figure 8B:
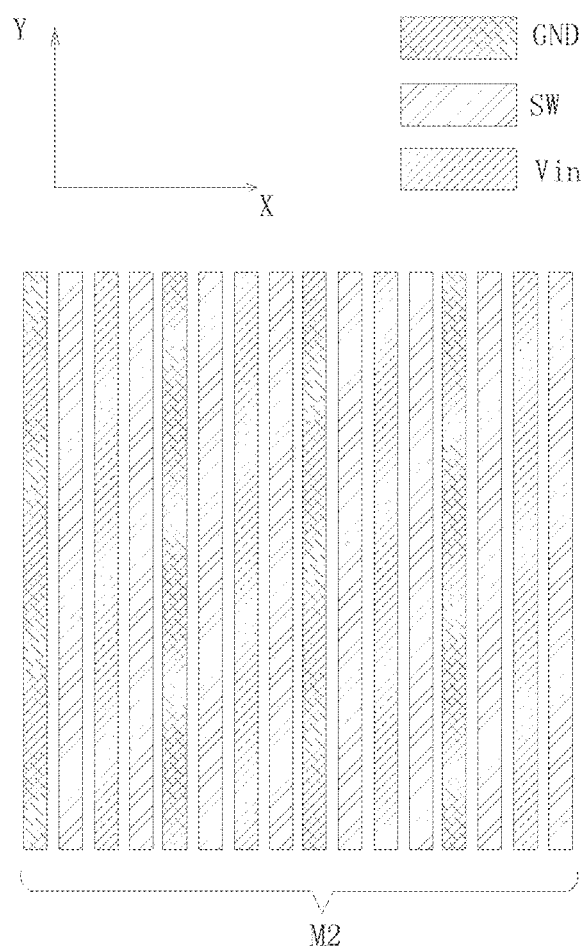
Figure 8C:
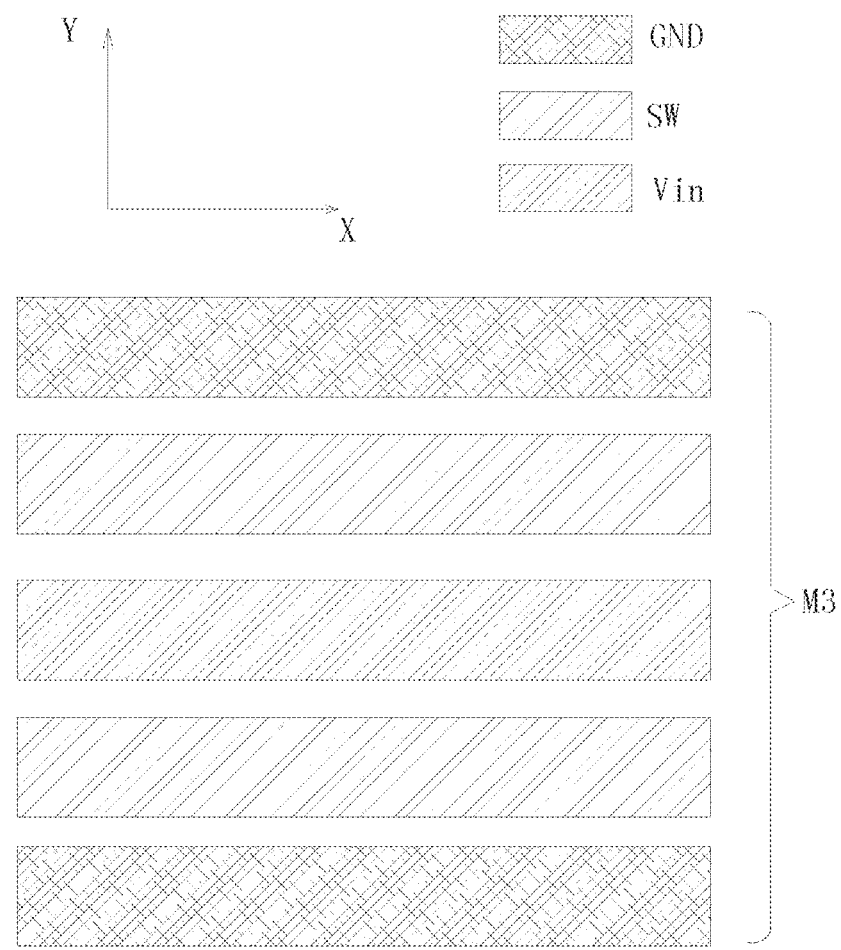

FIGS. 8a-8c show schematic diagrams of wiring metal region in a power chip according to an embodiment of the present disclosure. As shown in FIGS. 8a-8c, the metal region 102 at least includes a first metal layer M1, a second metal layer M2 and a third metal layer M3 that are stacked in sequence. Each metal layer respectively includes a first strip electrode Vin, a second strip electrode SW and a third strip electrode GND, A thickness of the first strip electrode Vin, the second strip electrode SW and the third strip electrode GND in the first metal layer M1, the second metal layer M2 and the third metal layer M3 increases layer by layer. Strip electrodes with the same voltage potential in two adjacent metal layers are electrically coupled. For example, the first strip electrode Vin in the first metal layer M1 and that in the second metal layer M2 are coupled. The second strip electrode SW in the first metal layer M1 and that in the second metal layer M2 are coupled. The third strip electrode GND in the first metal layer M1 and that in the second metal layer M2 are coupled. The first strip electrode Vin in the second metal layer M2 and that in the third metal layer M3 are coupled. The second strip electrode SW in the second metal layer M2 and that in the third metal layer M3 are coupled. The third strip electrode GND in the second metal layer M2 and that in the third metal layer M3 are coupled. In this way, a routing path from the wafer region to the third metal layer M3 may be reduced, thus reducing the conduction loss in the metal layer.

As shown in FIG. 8a, the first metal layer M1 is located above the alternately arranged first power switch T1 and the second power switch T2. In a region above the first power switch T1, the first strip electrode Vin and the second strip electrode SW in the first metal layer M1 are alternately arranged in parallel. The first strip electrode Vin is connected with the first metal electrode of the first power switch T1 through a via hole. The second strip electrode SW is connected with the second metal electrode of the first power switch T1 through a via hole. In a region above the second power switch T2, the second strip electrode SW and the third strip electrode GND in the first metal layer M1 are alternately arranged in parallel. The second strip electrode SW is connected with the third metal electrode of the second power switch T2 through a via hole. The third strip electrode GND is connected with the fourth metal electrode of the second power switch T2 through a via hole.

As shown in FIG. 8b, the second metal layer M2 is located above the first metal layer M1, Anyone of the first strip electrodes Vin in the second metal layer M2 is coupled with all of the first strip electrodes Vin in the first metal layer M1 above at least one of the first power switch T1 through a via hole. That is, a routing direction of the first strip electrode Vin in the first metal layer 1 is perpendicular to a direction along which the first power switch T1 and the second power switch T2 are alternately arranged. A routing direction of the first strip electrode Vin in the second metal layer M2 is perpendicular to a routing direction of the first strip electrode Vin in the first metal layer M1, so that anyone of the first strip electrodes Vin in the second metal layer M2 is coupled with all of the first strip electrodes Vin in the first metal layer M1 above at least one of the first power switch T1 through a via hole. Anyone of the third strip electrodes GND in the second metal layer M2 is coupled with all of the third strip electrodes GND in the first metal layer M1 above at least one of the second power switch T2 through a via hole. That is, a routing direction of the third strip electrode GND in the first metal layer M1 is perpendicular to a direction along which the first power switch T1 and the second power switch T2 are alternately arranged. A routing direction of the third strip electrode GND in the second metal layer M2 is perpendicular to a routing direction of the third strip electrode GND in the first metal layer M1, so that anyone of the third strip electrodes GND in the second metal layer M2 is coupled with all of the third strip electrodes GND in the first metal layer M1 above at least one of the second power switch T2 through a via hole. Anyone of the second strip electrodes SW in the second metal layer M2 is coupled with all of the second strip electrodes SW in the first metal layer M1 above at least one of the first power switch T1 or the second power switch T2 through a via, hole. That is, a routing direction of the second strip electrode SW in the first metal layer M1 is perpendicular to a direction along which the first power switch T1 and the second power switch T2 are alternately arranged, A routing direction of the second strip electrode SW in the second metal layer M2 is perpendicular to a routing direction of the second strip electrode SW in the first metal layer M1, so that anyone of the second strip electrodes SW in the second metal layer M2 is coupled with all of the second strip electrodes SW in the first metal laser M1 above at least one of the first power switch T1 or the second power switch T2 through a via hole, in this embodiment, the first strip electrode Vin, the second strip electrode SW and the third strip electrode GND in the second metal layer M2 extend across the entire wafer region of the power chip. In addition, the first strip electrode Vin, the second strip electrode SW and the third strip electrode GND in the second metal layer are alternately arranged in parallel, which simplifies a manufacturing process of the metal layer.

As shown in FIG. 8c, the third metal layer M3 is located above the second metal layer M2. Anyone of the first strip electrodes Vin in the second metal layer M2 is coupled with at least one of the first strip electrodes Vin of the third metal layer M3 through a via hole. Anyone of the second strip electrodes SW in the second metal layer M2 is coupled with at least one of the second strip electrodes SW of the third metal layer M3 through a via hole. Anyone of the third strip electrodes GND in the second metal layer M2 is coupled with at least one of the third strip electrodes GND of the third metal layer M3 through a via hole. A routing direction of the first strip electrode Vin, the second strip electrode SW and the third strip electrode GND of the third metal layer M3 is perpendicular to a routing direction of the first strip electrode yin, the second strip electrode SW and the third strip electrode GND in the second metal layer M2. In addition, the first strip electrode Vin, the second strip electrode SW and the third strip electrode GND in the third metal layer M3 are also alternately arranged in parallel.

In the present disclosure, an arrangement manner of the metal layers is designed based on the characteristics of the alternately arranged first power switch T1 and second power switch T2. Therefore, electrodes with the same potential between adjacent metal layers overlap with each other, which makes full use of space, reduces a routing length of respective electrodes from the power chip to the third metal layer M3, thus reducing the conduction loss in the metal layer, also filling up the vacancy in the metal layer design based on a scheme that the first power switch T1 and the second power switch T2 are alternately arranged.

Figure 9A:
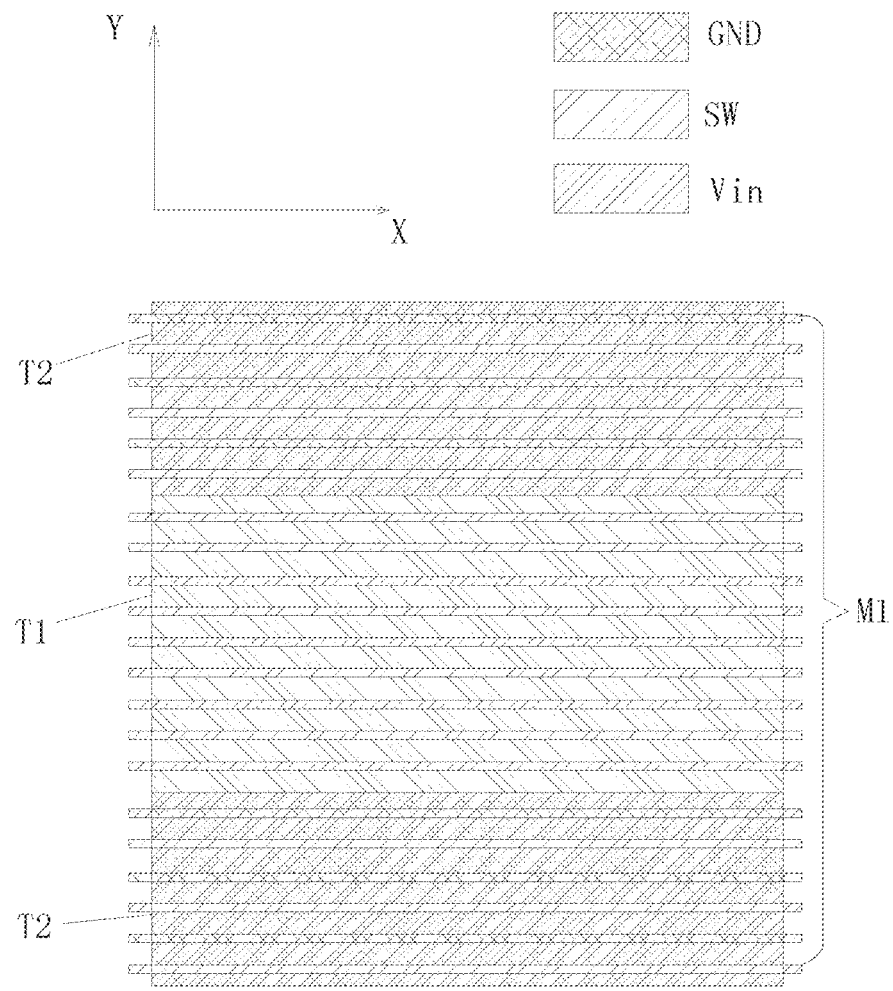
FIGS. 9a-9c show schematic diagrams of wiring of a metal region in a power chip according to another embodiment of the present disclosure.
Figure 9B:
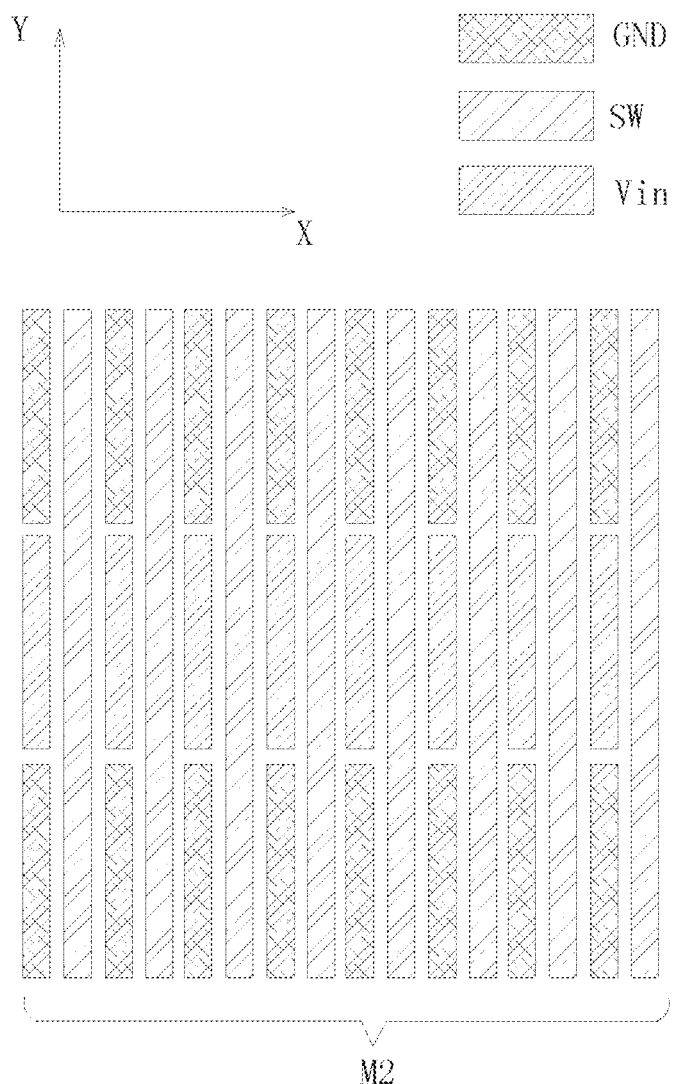
Figure 9C:
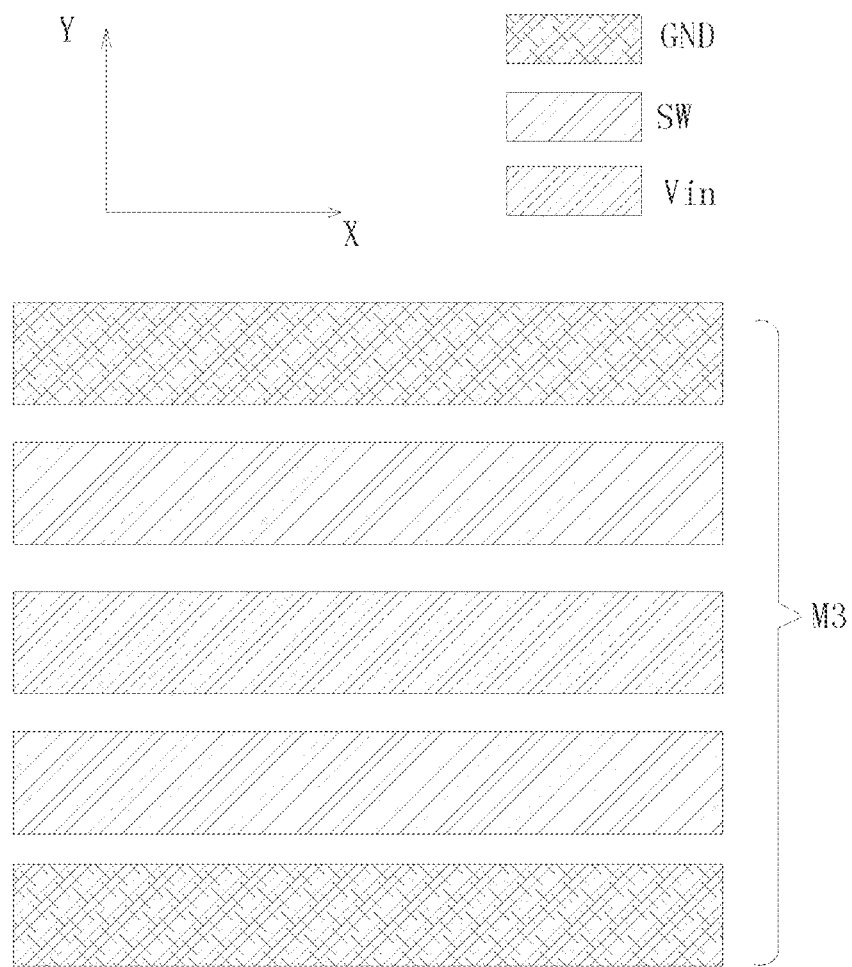

FIGS. 9a-9c show schematic diagrams of wiring of a metal region in a power chip according to another embodiment of the present disclosure. Compared with the above embodiment, the main difference in the present embodiment lies in a routing manner of the first strip electrode Vin, the second strip electrode SW and the third strip electrode GND in the second metal layer M2. As shown in FIG. 9b, anyone of the first strip electrodes Vin in the second metal layer M2 is only coupled with a first strip electrode Vin in the first metal layer M1 which is directly above the first power switch T1 through a via hole. That is, the first strip electrode Vin in the second metal layer M2 is disposed only above the first power switch T1, but not above the second power switch T2. The third strip electrode GND in the second metal layer M2 is only coupled with a third strip electrode GND in the first metal layer M1 which is directly above the second power switch T2 through a via hole. That is, the third strip electrode CND in the second metal layer M2 is disposed only above the second power switch T2, and the third strip electrode GND in the second metal layer M2 is not disposed above the first power switch T1. The laminating order of the first metal layer M1, the second metal layer M2 and the third metal layer M3 in the power chip is as shown in FIG. 8. In the present embodiment, the region above the second power switch T2 is assigned to the third strip electrode GND in the second metal layer M2, and the region above the first power switch T1 is assigned to the first strip electrode Vin in the second metal layer M2, which improves spatial utilization rate, and reduces resistance of the metal layer.

Figure 10A:
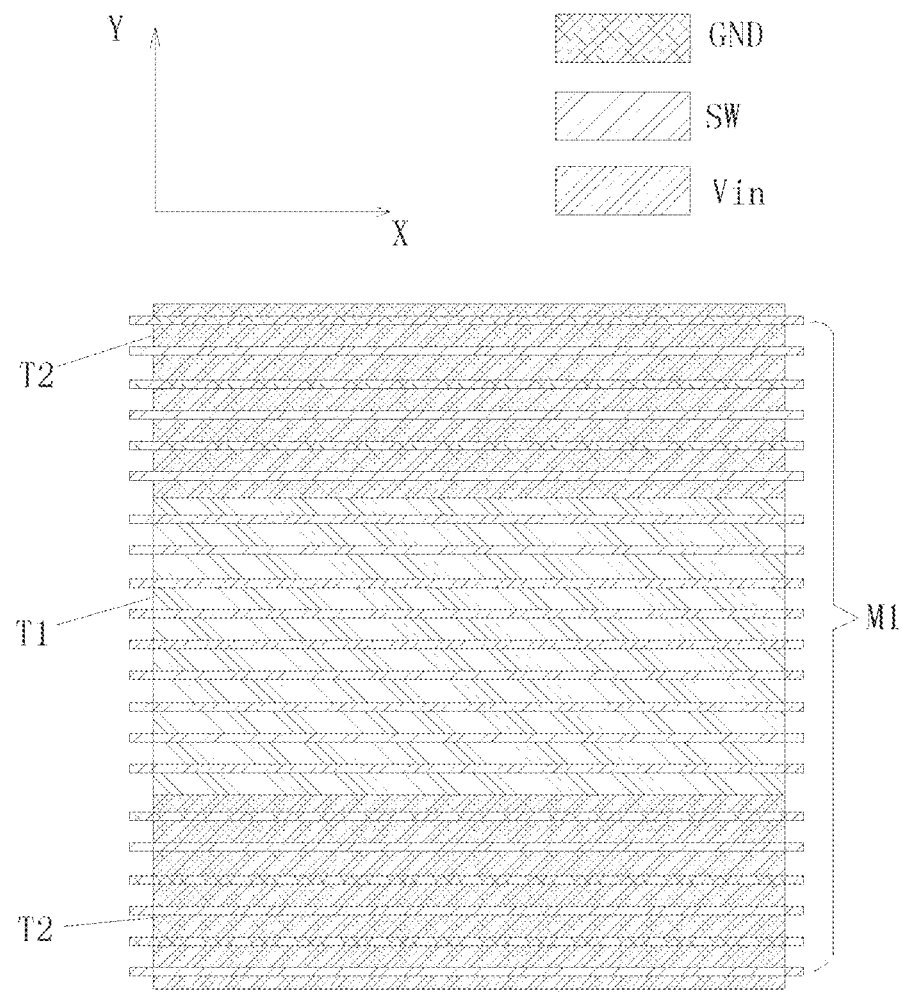
FIGS. 10a-10c show schematic diagrams of wiring of a metal region in a power chip according to a further embodiment of the present disclosure.
Figure 10B:
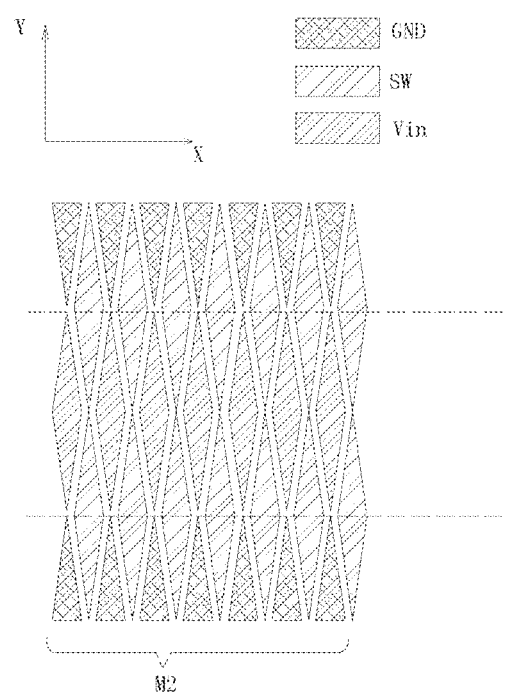
Figure 10C:
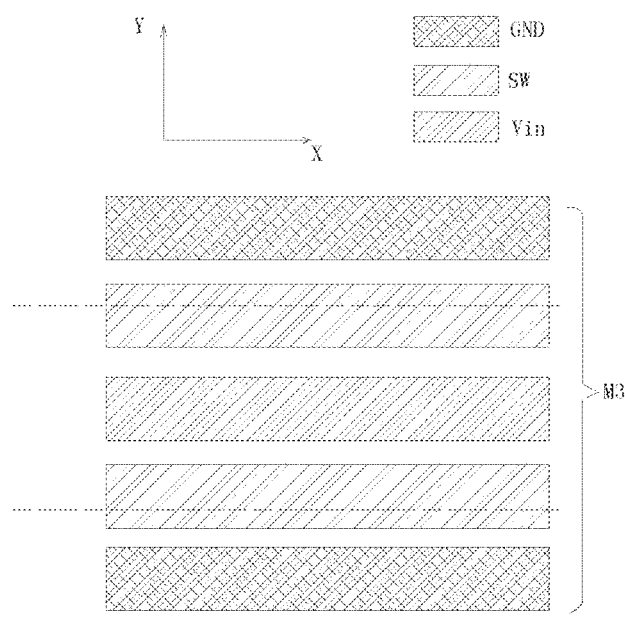

FIGS. 10a-10c show schematic diagrams of wiring of a metal region in a power chip according to a further embodiment of the present disclosure. Compared with the above embodiments, the main difference in the present embodiment lies in that widths of the first strip electrode Vin, the second strip electrode SW and the third strip electrode GND in the second metal layer M2 are different. As shown in FIG. 10b, in the second metal layer M2, the first strip electrode Vin, the second strip electrode SW and the third strip electrode GND may have different widths. An arrangement width of a region with a high current density in each strip electrode is larger than an arrangement width of a region with a low current density. The region with a high current density in each strip electrode corresponds to a position where the strip electrodes with the same potential in adjacent metal layers are coupled. Taking the second strip electrode SW for example, a position where the second strip electrode SW in the third metal layer M3 and the second strip electrode SW in the second metal layer M2 are coupled is shown as the dashed line in the figure. Accordingly, the second strip electrode SW at the dashed line in the second metal layer M2 corresponds to the region with a high current density. A position of the second strip electrode SW away from the dashed line in the second metal layer M2 corresponds to the region with a low current density. Similarly, the widths of the first strip electrode fin and the third strip electrode GND in the second metal layer M2 may be set accordingly. In the present embodiment, width of the strip electrode a high current density in the second metal layer M2 is increased, and a region of the strip electrode with a low current density in the second metal layer M2 is decreased, which may further reduce resistance of the metal layer, and improve current non-uniformity caused when routing current in the second metal layer M2 converges to the position of the via hole connected with the third metal layer M3.

Figure 11A:
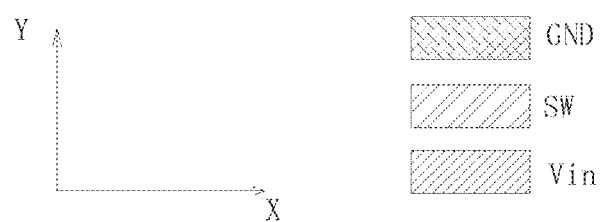
FIGS. 11a-11c show schematic diagrams of wiring of a metal region in a power chip according to a further embodiment of the present disclosure.
Figure 11A:
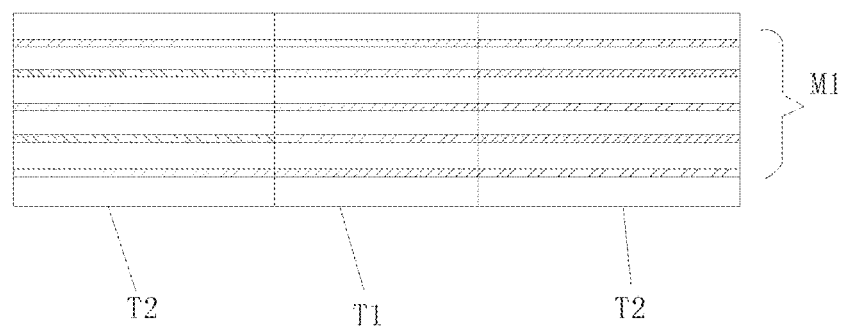
Figure 11B:
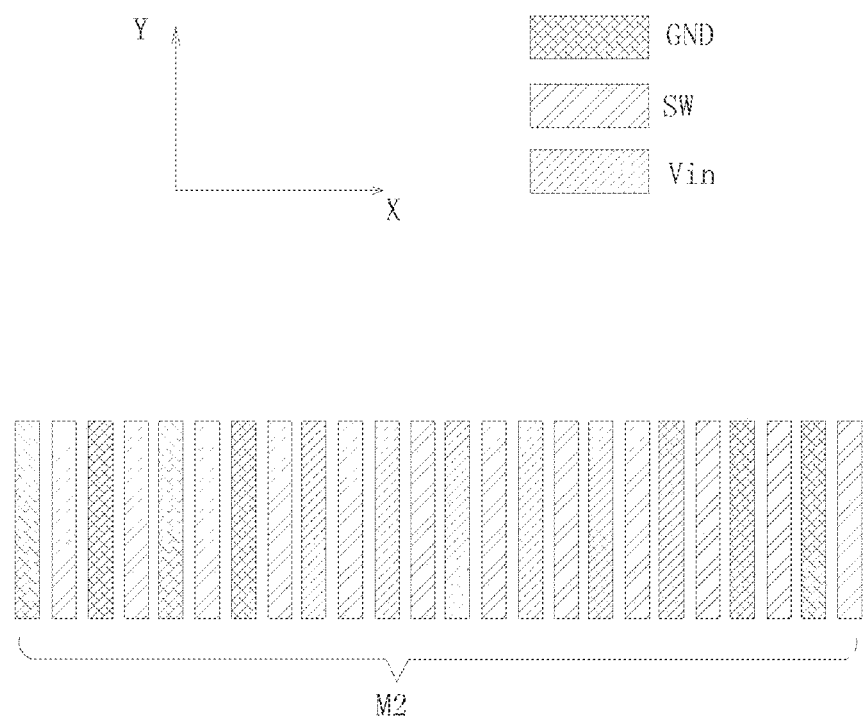
Figure 11C:
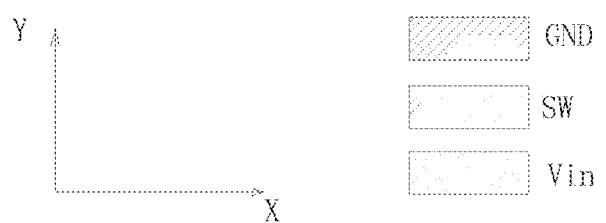
Figure 11C:
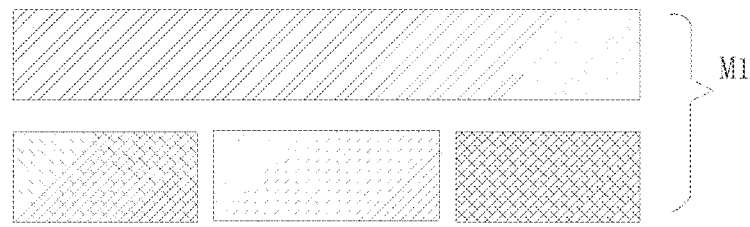

FIGS. 11a-11c show schematic diagrams of wiring of a metal region in a power chip according to a further embodiment of the present disclosure. Compared with the above embodiments, the main difference in the present embodiment lies in that an alternative arrangement direction of the power switch is different from that of the strip electrode. As shown in FIG. 11a, the first power switch T1 and the second power switch T2 are alternately arranged along the X direction. The first strip electrode Vin, the second strip electrode SW and the third strip electrode GND in the first metal layer M1 are alternately arranged in parallel along the Y direction perpendicular to the X direction. That is, the first strip electrode Vin and the second strip electrode SW in the first metal layer M1 above the first power switch T1 are alternately arranged in parallel along the Y direction. The third strip electrode GND and the second strip electrode SW in the first metal layer M1 above the second power switch T2 are alternately arranged in parallel along the Y direction. As shown in FIG. 11b, the first strip electrode Vin, the second strip electrode SW and the third strip electrode GND in the second metal layer M2 are alternately arranged in parallel along the X direction. That is, the first strip electrode Vin and the second strip electrode SW in the second metal layer M2 above the first power switch T1 are alternately arranged in parallel along the X direction. The third strip electrode GND and the second strip electrode SW in the second metal layer M2 above the second power switch T2 are alternately arranged in parallel along the X direction. As shown in FIG. 11c, the first strip electrode Vin and the second strip electrode SW in the third metal layer M3 are alternately arranged in parallel along the Y direction. The third strip electrode GND and the second strip electrode SW in the third metal layer M3 are alternately arranged in parallel along the Y direction. The first strip electrode Vin and the third strip electrode GND in the third metal layer M3 are alternately arranged in parallel along the X direction.

Figure 12:
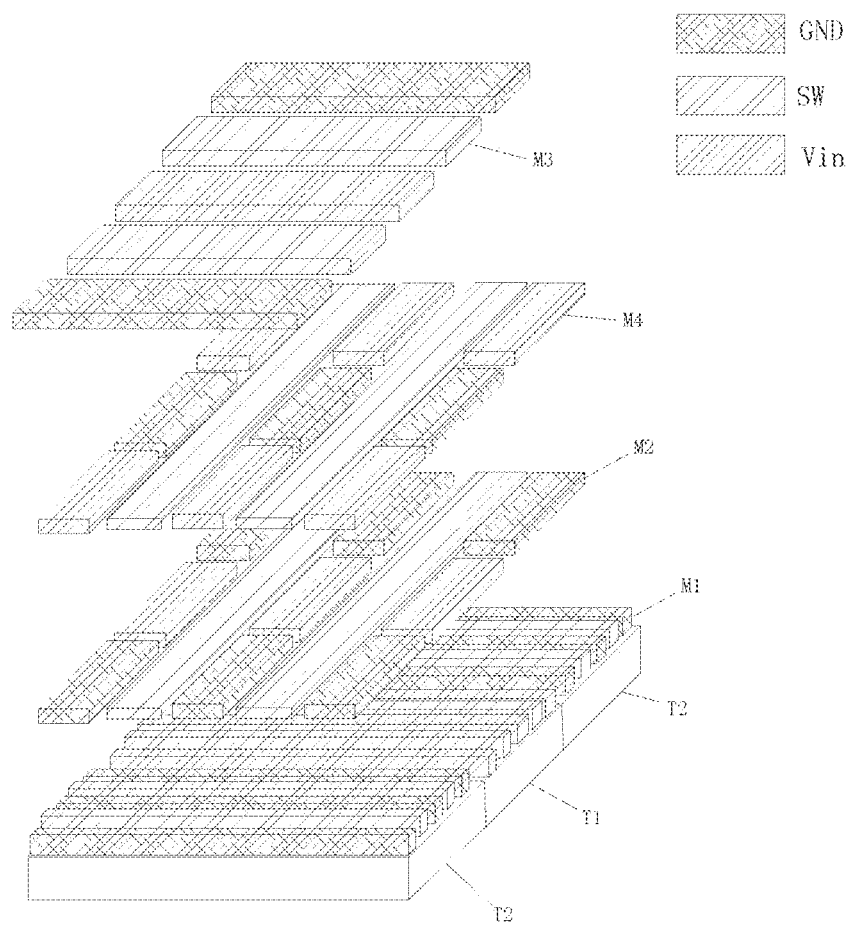
FIG. 12 shows a stereoscopic view of a power chip according to an embodiment of the present disclosure.
Figure 12A:
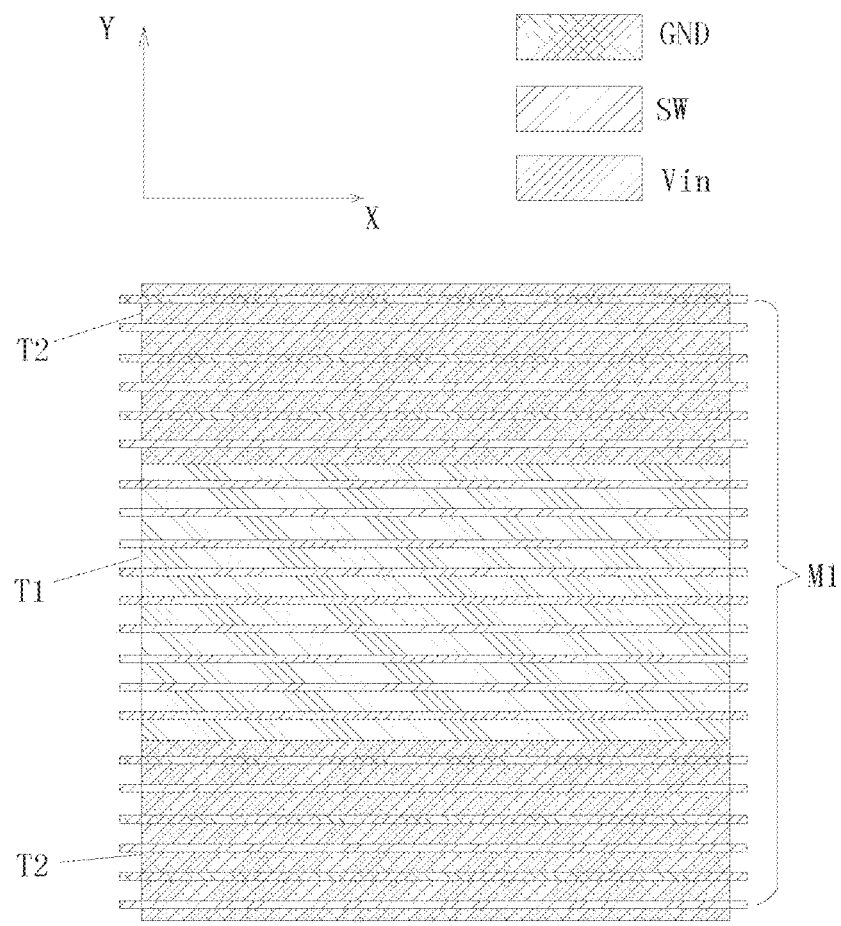
FIGS. 12a-12d show schematic diagrams of wiring of a metal region in a power chip according to a further embodiment of the present disclosure.
Figure 12B:
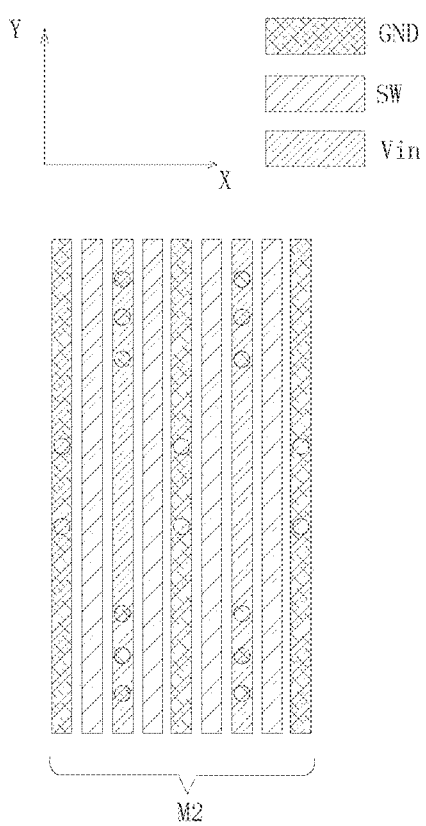
Figure 12C:
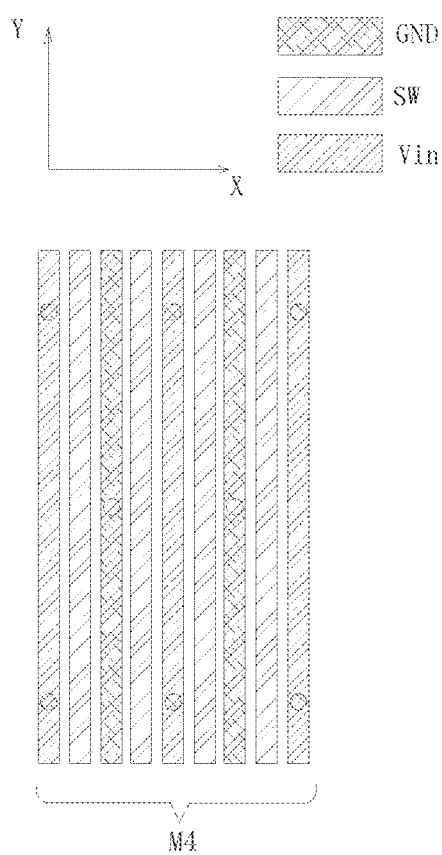
Figure 12D:
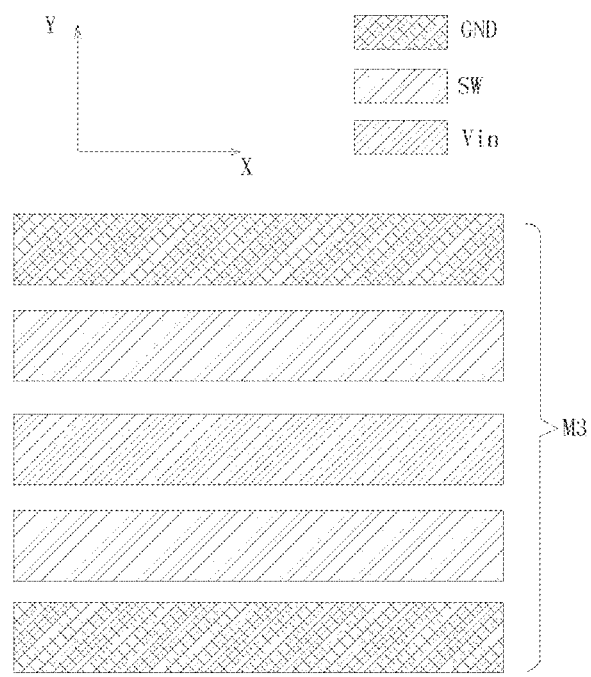
Figure 12E:
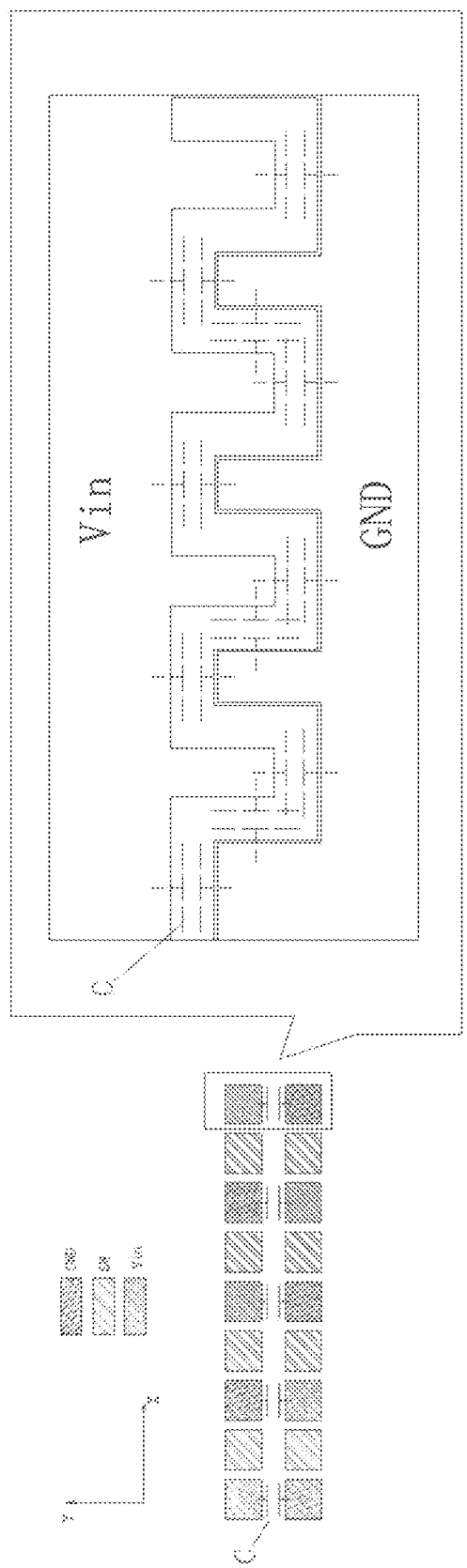
FIG. 12e shows a structural schematic diagram of an input capacitor formed in the metal region in a power chip according to an embodiment of the present disclosure.

FIG. 12 shows stereoscopic view of a power chip according to an embodiment of the present disclosure. FIGS. 12a-12d show schematic diagrams of wiring of a metal region in a power chip according to an embodiment of the present disclosure. As shown in FIG. 12, in the present embodiment, a fourth metal layer M4 is added between the third metal layer M3 and the second metal layer M2. As shown in FIGS. 12b-12c, the first strip electrode Vin, the second strip electrode SW and the third strip electrode GND in the second metal layer M2 and the fourth metal layer M4 are alternately arranged in parallel. The third strip electrode GND in the fourth metal layer M4 is above the first strip electrode Vin in the second metal layer M2, The first strip electrode Vin in the fourth metal layer M4 is above the third strip electrode GND in the second metal layer M2. By performing direct oxidation or anodic oxidation on the first strip electrode Vin and the third strip electrode GND facing each other in the second metal layer M2 and the fourth metal layer 4, a metallic oxide with a honeycomb structure is generated between the first strip electrode Vin and the third strip electrode GND, thus forming a built-in input capacitor, as shown in FIG. 12e. In this embodiment, the metallic oxide may be barium titanate, barium strontium titanate or the like, which is formed by a chemical vapor deposition process or a physical vapor deposition process. Linder some conditions, a certain heat treatment process may be also needed to sufficiently activate performance of material. The metallic oxide may also be aluminium oxide, tantalum oxide or niobium oxide or the like, which is formed by a direct oxidation or an anodic oxidation process. The anodic oxidation process may form a honeycomb structure on a surface of the metallic oxide, which greatly increases a superficial area of the metallic oxide, thus effectively increasing the capacitance. In addition, in an alternative embodiment of FIG. 12, respective strip electrodes in the second metal layer M2 and respective strip electrodes in the fourth metal layer M4 all extend across the entire wafer region, which is similar to the strip electrodes in the first metal layer or the third metal layer as shown in FIG. 12.

Figure 13:
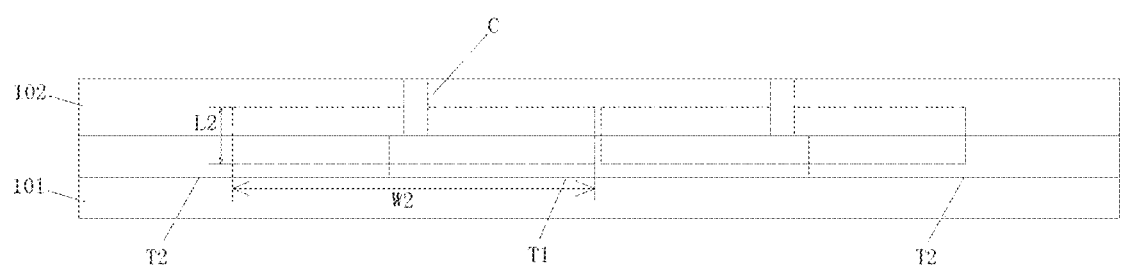
FIG. 13 shows a schematic diagram of an equivalent commutation circuit formed by a power switch and an input capacitor in the metal region.

FIG. 13 shows a schematic diagram of an equivalent commutation circuit formed by a power switch and an input capacitor in the metal region. As shown in FIG. 13, when the capacitor C is disposed in the metal region, a distance L2 between the capacitor C and the geometrical centers of the first power switch T1 and the second power switch T2 in the wafer region 101 corresponds to thicknesses of the metal region 102, the first power switch T1 and the second power switch T2. The distance L2 is far smaller than the distance L1 between the geometrical centers of the power switches and the capacitor as shown in FIG. 6. In the present embodiment, an area of the commutation circuit is S3=W2*L2. Since L2<L1 and W2<W1, the area S3 of the commutation circuit in the present embodiment is smaller than the area S2 of the commutation circuit in the embodiment as shown in FIG. 6. Therefore, the influence of the parasitic inductance is greatly weakened, and efficiency of the power chip is improved.

Figure 14A:
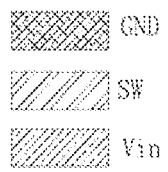
FIG. 14a shows a stereoscopic view of a power chip according to an embodiment of the present disclosure.
Figure 14A:
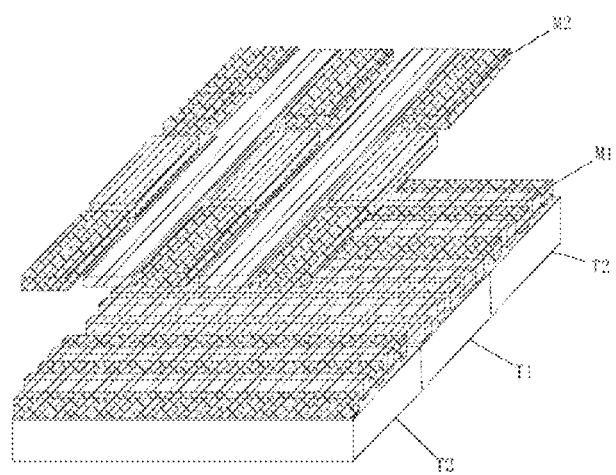
Figure 14B:
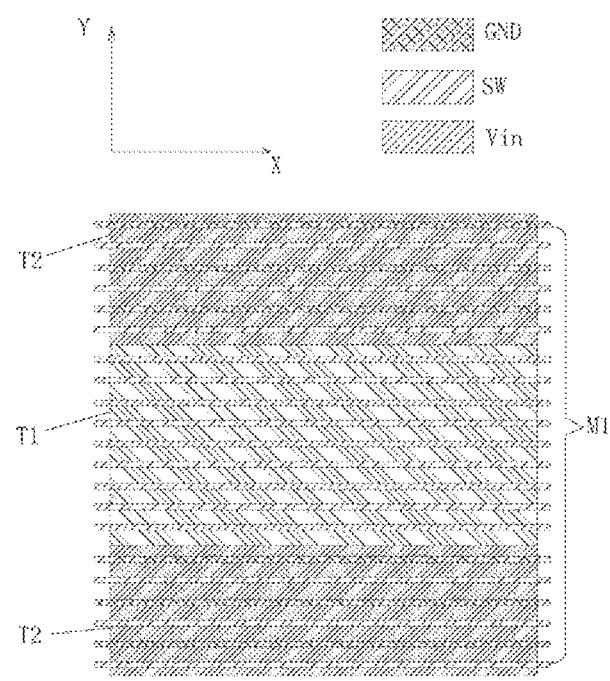
FIGS. 14b-14c show schematic diagrams of wiring of a metal region in a power chip according to an embodiment of the present disclosure.
Figure 14C:
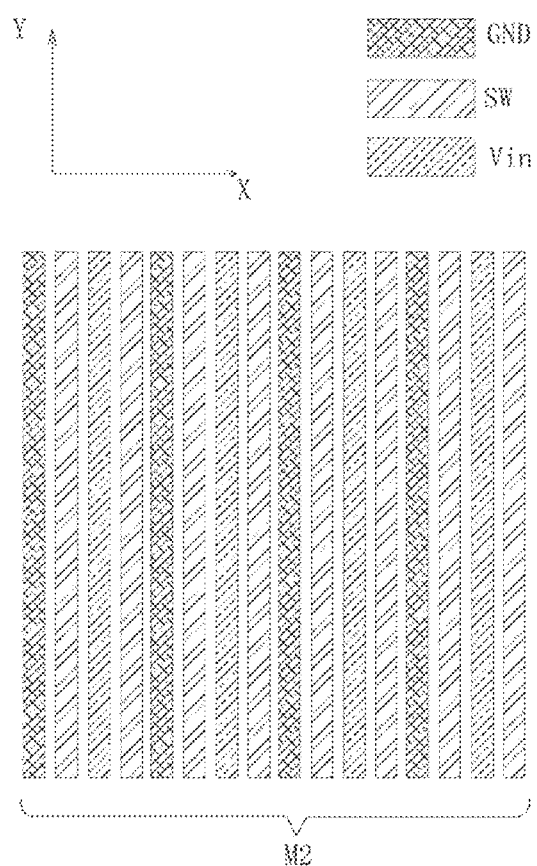
Figure 14D:
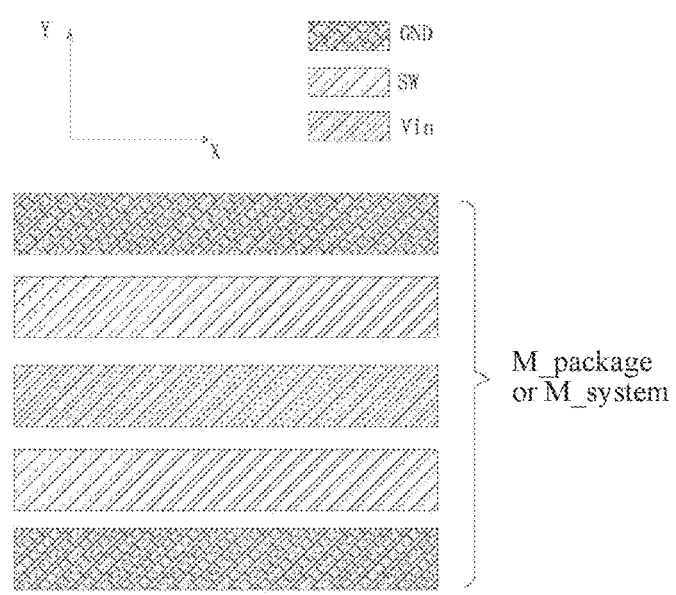
FIG. 14d shows schematic diagrams of wiring of an external metal wiring layer according to an embodiment of the present disclosure.

FIG. 14a shows a stereoscopic view of a power chip according to an embodiment of the present disclosure. FIGS. 14b-14c show schematic diagrams of wiring of a metal region in a power chip according to an embodiment of the present disclosure. FIG. 14d shows schematic diagrams of wiring of an external metal wiring layer according to an embodiment of the present disclosure. Similar to those shown in FIGS. 8a-8b, the metal region at least includes a first metal layer M1 (shown in FIG. 14b), and a second metal layer M2 (shown in FIG. 14c) that are stacked in sequence. Each metal layer respectively includes a first strip electrode fin, a second strip electrode SW and a third strip electrode GND. Strip electrodes with the same voltage potential in two adjacent metal layers are electrically coupled. For example, the first strip electrode Vin in the first metal layer M1 and that in the second metal layer M2 are coupled. The second strip electrode SW in the first metal layer M1 and that in the second metal layer M2 are coupled. The third strip electrode GND in the first metal layer M1 and that in the second metal layer M2 are coupled. For example, electrodes with the same potential in adjacent metal layers overlap with each other. The present embodiment differs from that shown in FIGS. 8a-8c in that: the metal region of the power chip includes only the metal layer M1 corresponding to that shown in FIG. 8a and the metal layer M2 corresponding to that shown in FIG. 8b, while do not have the third metal layer M3 which is located inside the power chip as shown in FIG. 8c, In this embodiment, an external metal wiring layer is provided, which includes an external first strip electrode Vin, an external second strip electrode SW and an external third strip electrode GND. The external metal wiring layer is located outside the power chip. The external strip electrodes are electrically coupled to and overlap with the strip electrodes with the same voltage potential in the metal layer of the metal region adjacent to the external metal wiring layer. For example, the second metal layer M2 is adjacent to the external metal wiring layer, then the first strip electrode Vin in the second metal layer M2 and the external first strip electrode Vin in the external wiring layer are coupled, the second strip electrode SW in the second metal layer M2 and the external second strip electrode SW in the external wiring layer are coupled, and the third strip electrode GND in the second metal layer M2 and the external third strip electrode GND in the external wiring layer are coupled.

In one embodiment, the external metal wiring layer may be formed of a metal wiring layer M_package of a package including the power chip. Alternatively, the external metal wiring layer may be formed of a metal wiring layer M_system of a system including the power chip. The metal wiring layer M_package may be a wiring layer formed in the package for providing electrical connection between elements in the package, and similarly, metal wiring layer M_system may be a wiring layer formed in the system for providing electrical connection between elements is in the system. The system may include a plurality of elements mounted on substrate or a print circuit board, while the present disclosure is not limited thereto.

Similar arrangement is also applicable for other embodiments shown in FIGS. 9a-9c, FIGS. 10a-10c, FIGS. 11a-11c and FIGS. 12a-12c. That is, the third metal layer M3 show in for example FIGS. 9c, 10c, 11c and 12c may be replaced by an external metal wiring layer as discussed above, while the patterns of these third metal layers remain those shown in FIGS. 9c, 10c, 11c and 12c. Repeated description regarding these embodiments will be omitted.

FIG. 15a-15d illustrate schematic plan diagrams showing an arrangements of the power switches in a power chip according to embodiments of the present disclosure.

Figure 15A:
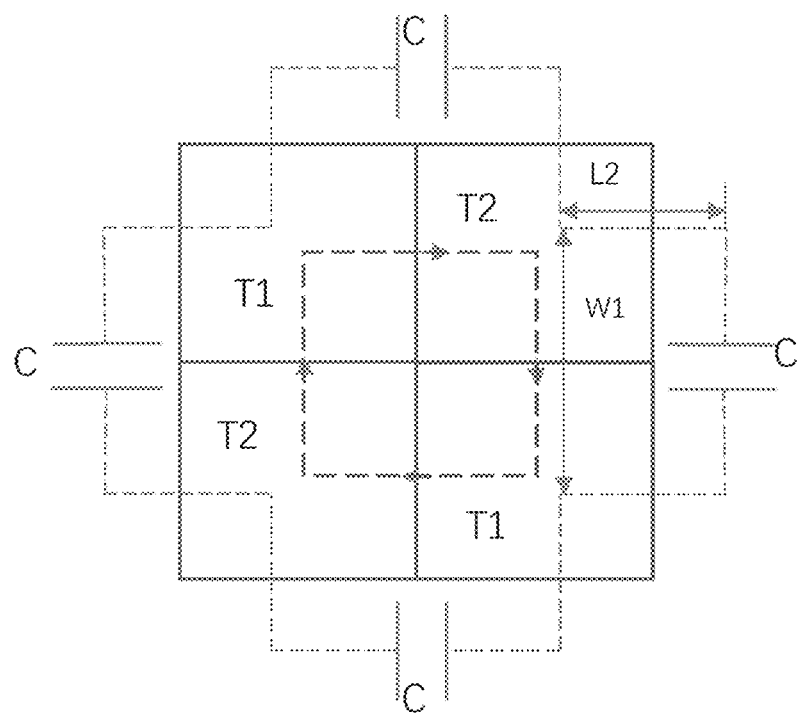
FIG. 15a-15d show schematic plan diagrams showing an arrangements of the power switches in a power chip according to embodiments of the present disclosure.

FIG. 15a is a schematic plan diagram showing an arrangement of the power switches in a power chip according to another embodiment of the present disclosure. In the present embodiment, the first power switch T1 and the second power switch T2 are arranged alternatively along a closed loop. Specifically, the lines connecting the geometric centers of the power switches T1 and the power switches T2 may form a quadrilateral shape. Under the same area of the power chip, compared with the case as shown in FIG. 6 where the first and second power itches are separately arranged, the case in the present embodiment the first and second powers witches are arranged alternatively may reduce the distance between the geometrical centers of the power switches and the capacitors, i.e. L2<L1. When the distance between the geometrical centers of the first and second power switches W1 is the same, the area of the commutation circuit loop correspondingly decreases, thus reducing the size of the commutation circuit loop, weakening the influence of the parasitic inductance, and improving efficiency of the power chip.

Figure 15B:
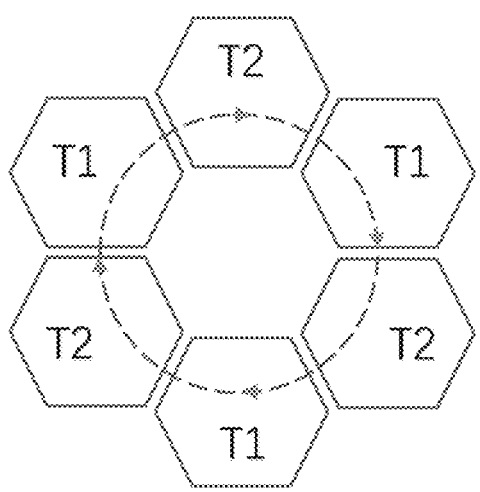

FIG. 15b is a schematic plan diagram showing an arrangement of the power switches in a power chip according to another embodiment of the present disclosure. In the present embodiment, the first power switch T1 and the second power switch T2 are arranged alternatively along a closed loop. Specifically, the lines connecting geometric centers of the power switches T1 and the power switches T2 may form a hexagonal shape or a circle. It is worthwhile to mention that the power switches T1 and power switches T2 can be arranged along any closed loop of any shapes, for example, polygons, circles, ovals, or any irregular closed loops. In the present embodiment, the first and second power switches T1 and T2 are arranged alternatively for three times, however, the times that the first and second power switches are arranged alternatively may vary depending on actual requirements.

Figure 15C:
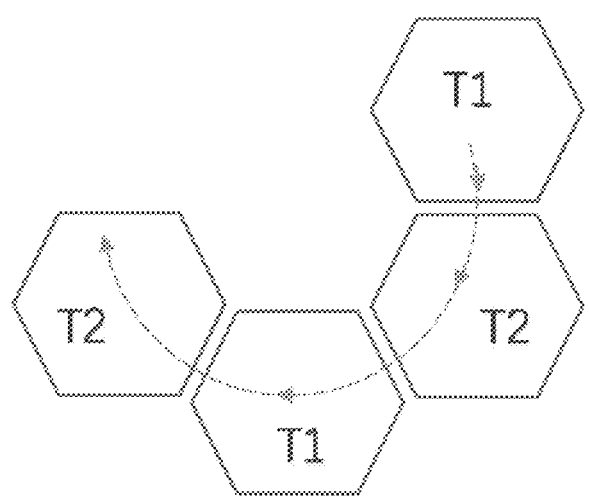

FIG. 15c is a schematic plan diagram showing an arrangement of the power switches in a power chip according, to another embodiment of the present disclosure. In the present embodiment, the first power switch T1 and the second power switch T2 are arranged alternatively along a curve or a polyline. Specifically, the geometric centers of the power switches T1 and the power switches T2 are arranged alternatively for twice (T1→T2→T1→T2) along a curve. However, the times that the first and second power switches are arranged alternatively may vary depending on actual requirements.

Figure 15D:
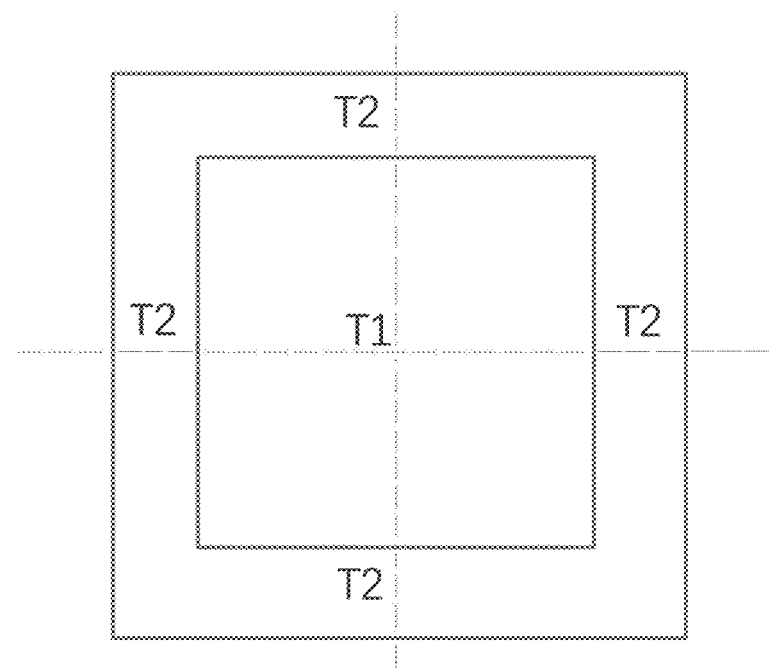

FIG. 15d is a schematic plan diagram showing an arrangement of the power switches in a power chip according to another embodiment of the present disclosure. In the present embodiment, the first power switch T1 is surrounded by the second power switch T2, and geometric centers of the power switches T1 and the power switches T2 are arranged alternatively along two directions, i.e., both the horizontal direction and the vertical direction. For example, the geometric centers of the power switches T1 and the power switches T2 are arranged alternatively in a horizontal direction by the sequence T2→T1→T2. However, the direction along which the geometric centers of the power switches T1 and the power switches T2 are arranged alternatively is not limited to the horizontal direction and the vertical direction, other directions are also possible depending on actual requirements.

In the above embodiments, both the first power switch T1 and the second power switch T2 are lateral type power devices. Each power switch may be, for example, a MOS transistor, including a source electrode and a drain electrode. The source electrode and the drain electrode are located at the same side of the power chip, to facilitate a connection with the metal region nearby.

Although the above implementation has disclosed specific embodiments of the present disclosure, it does not limit the present disclosure. Those skilled in the art may make various variation and modification without departing from the scope and sprit of the present disclosure. The protection scope of the present disclosure is subject to the scope defined by the claims.

What is claimed is:

1. A power chip, comprising:
   a first power switch, formed in a wafer region, each first power switch having a first metal electrode and a second metal electrode;
   a second power switch, formed in the wafer region, each second power switch having a third metal electrode and a fourth metal electrode, wherein the first power switch and the second power switch respectively constitute an upper bridge arm and a lower bridge arm of a bridge circuit, at least one bridge arm of the upper bridge arm and the lower bridge arm comprises two or more power switches parallel to each other, wherein the first power switch and the second power switch are arranged alternately; and
   a metal region, comprising a first metal layer and a second metal layer that are stacked, wherein each of the first metal layer and the second metal layer comprises first electrodes, second electrodes and third electrodes, and electrodes among the first, second and third electrodes with a same voltage potential in the first metal layer and the second metal layer are electrically coupled.

2. The power chip according to claim 1, wherein a line connecting geometric centers of a first pair of adjacent first and second power switches and a line connecting geometric centers of a second pair of adjacent first and second power switches are in different directions.

3. The power chip according claim 1, wherein lines connecting geometric centers of each pair of adjacent first and second power switches form a curve or a polyline or a straight line.

4. The power chip according claim 1, wherein lines connecting geometric centers of each pair of adjacent first and second power switches form a closed loop.

5. The power chip according to claim 1, wherein the first electrodes, second electrodes and third electrodes are first strip electrodes, second strip electrodes and third strip electrodes, respectively.

6. The power chip according to claim 5, wherein the first power switch and the second power switch are arranged alternately along a first direction, and a routing direction of at least one of the first strip electrodes, second strip electrodes and third strip electrodes in the first metal layer is substantially perpendicular to the first direction.

7. The power chip according to claim 5, wherein the first metal layer is located above the first and second power switches which are arranged alternately,
   the first and second strip electrodes in the first metal layer are alternately arranged in parallel in a region above the first power switch, and each of the first strip electrodes in the first metal layer is coupled with the first metal electrode of the first power switch, each of the second strip electrodes in the first metal layer is coupled with the second metal electrode of the first power switch;
   the second and third strip electrodes in the first metal layer are alternately arranged in parallel in a region above the second power switch, and each of the second strip electrodes in the first metal layer is coupled with the third metal electrode of the second power switch, each of the third strip electrodes in the first metal layer is coupled with the fourth metal electrode of the second power switch.

8. The power chip according to claim 5, wherein the second metal layer is located above the first metal layer and in a region above at least one of the first power switch, any of the first strip electrodes in the second metal layer is coupled with all of the first strip electrodes in the first metal layer; or
   wherein the second metal layer is located above the first metal layer and in a region above the second power switch, any of the third strip electrodes in the second metal layer is coupled with all of the third strip electrodes in the first metal layer; or
   wherein the second metal layer is located above the first metal layer and in a region above the first power switch and the second power switch, any of the second strip electrodes in the second metal layer is coupled with all of the second strip electrodes in the first metal layer.

9. The power chip according to claim 5, wherein a routing direction of at least one of the first strip electrodes, second strip electrodes and third strip electrodes in the second metal layer is substantially perpendicular to the routing direction of at least one of the first strip electrodes, second strip electrodes and third strip electrodes in the first metal layer.

10. The power chip according to claim 5, wherein
    the first and second strip electrodes in the second metal layer are alternately arranged in parallel; and
    the second and third strip electrodes in the second metal layer are alternately arranged in parallel.

11. The power chip according to claim 10, wherein the second metal layer is located above the first metal layer,
    at least part of the projection of the first strip electrodes in the second metal layer is located within the surface area of the first power switch, and
    at least part of the projection of the third strip electrodes in the second metal layer is located within the surface area of the second power switch.

12. The power chip according to claim 10, wherein in the second metal layer, an arrangement width of a region with a high current density is larger than an arrangement width of a region with a low current density in each of the first, second and third strip electrodes.

13. The power chip according to claim 5, wherein the power chip is electrically coupled to a third metal layer, which comprises first strip electrodes, second strip electrodes and third strip electrodes, strip electrodes in the third metal layer are electrically coupled to strip electrodes with a same voltage potential in the second metal layer that is adjacent to the third metal layer;

wherein the third metal layer is located inside or outside the power chip.

14. The power chip according to claim 13, a width of the strip electrodes having a voltage level in the first metal layer is smaller than that of the strip electrodes having the voltage level in the second metal layer and the width of the strip electrodes having the voltage level in the second metal layer is smaller than that of the strip electrodes having the voltage level in the third metal layer.

15. The power chip according to claim 13, wherein the third metal layer is formed of a package metal wiring layer of a package including the power chip or a system metal wiring layer of a system including the power chip, wherein the package metal wiring layer is a wiring layer formed in the package for providing electrical connection between elements in the package, and the system metal wiring layer is a wiring layer formed in the system for providing electrical connection between elements in the system.

16. The power chip according to claim 13, wherein the third metal layer is located above the second metal layer, and any of the first strip electrodes in the third metal layer is coupled with all of the first strip electrodes in the second metal layer, any of the third strip electrodes in the third metal layer is coupled with all of the third strip electrodes in the second metal layer and any of the second strip electrodes in the third metal layer is coupled with all of the second strip electrodes in the second metal layer.

17. The power chip according to claim 16, wherein a routing direction of at least one of the first strip electrodes, second strip electrodes and third strip electrodes in the third metal layer is substantially perpendicular to a routing direction of at least one of the first strip electrodes, second strip electrodes and third strip electrodes in the second metal layer.

18. The power chip according to claim 16, wherein the first, second and third strip electrodes in the third metal layer are arranged in parallel.

19. The power chip according to claim 16, wherein in the third metal layer, the first strip electrodes are arranged at one side of the second strip electrodes, and the third strip electrodes are arranged at the other side of the second strip electrodes.

20. The power chip according to claim 16, wherein in the third metal layer, an arrangement width of a region with a high current density is larger than an arrangement width of a region with a low current density in each of the first, second and third strip electrodes.

* * * * *